(12) United States Patent
Boot

(10) Patent No.: US 8,825,215 B2
(45) Date of Patent: Sep. 2, 2014

(54) POWER CONSUMPTION COMPLIANCE MONITORING SYSTEM AND METHOD

(75) Inventor: John Christopher Boot, Atlanta, GA (US)

(73) Assignee: General Electric Company, Schenectady, NY (US)

( * ) Notice: Subject to any disclaimer, the term of this patent is extended or adjusted under 35 U.S.C. 154(b) by 327 days.

(21) Appl. No.: 12/948,704

(22) Filed: Nov. 17, 2010

(65) Prior Publication Data

US 2012/0123995 A1 May 17, 2012

(51) Int. Cl.
*H02J 13/00* (2006.01)
*H02J 3/14* (2006.01)
*G01R 21/133* (2006.01)

(52) U.S. Cl.
CPC ......... *G01R 21/1333* (2013.01); *Y02B 70/3225* (2013.01); *H02J 3/14* (2013.01); *H02J 13/0006* (2013.01); *Y04S 20/222* (2013.01); *Y04S 2003/242* (2013.01); *H02J 2003/143* (2013.01); *Y02B 70/3266* (2013.01)
USPC ............................ 700/291; 700/286; 700/295

(58) Field of Classification Search
None
See application file for complete search history.

(56) References Cited

U.S. PATENT DOCUMENTS

| | | | |
|---|---|---|---|
| 4,347,575 A * | 8/1982 | Gurr et al. ...................... 700/295 |
| 4,858,141 A | 8/1989 | Hart et al. |
| 5,483,153 A * | 1/1996 | Leeb et al. ................. 324/76.12 |
| 5,696,695 A | 12/1997 | Ehlers et al. |
| 5,717,325 A * | 2/1998 | Leeb et al. ................. 324/76.12 |
| 6,216,956 B1 * | 4/2001 | Ehlers et al. ..................... 236/47 |
| 6,860,431 B2 * | 3/2005 | Jayadev .......................... 236/47 |
| 6,891,478 B2 * | 5/2005 | Gardner ........................ 340/635 |
| 6,906,617 B1 * | 6/2005 | Van der Meulen ........... 340/538 |
| 7,010,363 B2 | 3/2006 | Donnelly et al. |
| 7,184,861 B2 * | 2/2007 | Petite ............................ 700/295 |
| 7,373,222 B1 * | 5/2008 | Wright et al. ................. 700/295 |
| 7,379,791 B2 * | 5/2008 | Tamarkin et al. ............. 700/286 |
| 7,409,303 B2 | 8/2008 | Yeo et al. |
| 7,420,293 B2 | 9/2008 | Donnelly et al. |
| 7,528,503 B2 | 5/2009 | Rognli et al. |

(Continued)

FOREIGN PATENT DOCUMENTS

| | | | |
|---|---|---|---|
| WO | 2009103998 A2 | 8/2009 |
| WO | 2010007369 A2 | 1/2010 |
| WO | 2010008479 A2 | 1/2010 |
| WO | 2010030862 A1 | 3/2010 |

OTHER PUBLICATIONS

Hart, G.W.; , "Residential energy monitoring and computerized surveillance via utility power flows," Technology and Society Magazine, IEEE , vol. 8, No. 2, pp. 12-16, Jun. 1989.*

(Continued)

*Primary Examiner* — Kavita Padmanabhan
*Assistant Examiner* — Christopher E Everett
(74) *Attorney, Agent, or Firm* — Fletcher Yoder, P.C.

(57) ABSTRACT

Systems and methods for monitoring compliance with a request not to run a type of load (e.g., a high-power-consuming appliance) during a demand response event are provided. One such system may include storage containing a load profile representative of a pattern of power consumption by a type of load and data processing circuitry. The data processing circuitry may compare a power usage profile representing power consumption by a consumer at least over a period of time to the load profile to determine whether the consumer is running the type of load over the period of time.

19 Claims, 7 Drawing Sheets

(56) References Cited

U.S. PATENT DOCUMENTS

| | | | |
|---|---|---|---|
| 7,705,484 B2* | 4/2010 | Horst | 307/35 |
| 7,738,999 B2* | 6/2010 | Petite | 700/295 |
| 7,747,357 B2* | 6/2010 | Murdoch | 700/295 |
| 7,755,493 B2* | 7/2010 | Berenguer et al. | 340/573.1 |
| 7,873,441 B2* | 1/2011 | Synesiou et al. | 700/286 |
| 8,063,787 B2* | 11/2011 | Parker et al. | 340/635 |
| 8,090,480 B2* | 1/2012 | Brumfield et al. | 700/296 |
| 8,094,034 B2* | 1/2012 | Patel et al. | 340/657 |
| 8,121,737 B2* | 2/2012 | West et al. | 700/286 |
| 8,185,333 B2* | 5/2012 | Jonsson et al. | 702/66 |
| 8,290,635 B2* | 10/2012 | Cohen | 700/295 |
| 8,326,551 B2* | 12/2012 | Wirt | 702/58 |
| 2006/0259201 A1* | 11/2006 | Brown | 700/291 |
| 2007/0018852 A1* | 1/2007 | Seitz | 340/870.16 |
| 2007/0043478 A1* | 2/2007 | Ehlers et al. | 700/276 |
| 2008/0015742 A1* | 1/2008 | Kulyk et al. | 700/295 |
| 2008/0255899 A1* | 10/2008 | McConnell et al. | 705/7 |
| 2009/0063257 A1* | 3/2009 | Zak et al. | 705/10 |
| 2009/0187499 A1* | 7/2009 | Mulder et al. | 705/30 |
| 2009/0198384 A1 | 8/2009 | Ahn | |
| 2009/0307178 A1* | 12/2009 | Kuhns et al. | 706/54 |
| 2009/0326726 A1 | 12/2009 | Ippolito et al. | |
| 2010/0030393 A1* | 2/2010 | Masters et al. | 700/295 |
| 2010/0070091 A1* | 3/2010 | Watson et al. | 700/278 |
| 2010/0070103 A1 | 3/2010 | Fleck et al. | |
| 2010/0070214 A1* | 3/2010 | Hyde et al. | 702/61 |
| 2010/0070218 A1* | 3/2010 | Hyde et al. | 702/62 |
| 2010/0082174 A1 | 4/2010 | Weaver | |
| 2010/0088261 A1* | 4/2010 | Montalvo | 706/15 |
| 2010/0106342 A1* | 4/2010 | Ko et al. | 700/295 |
| 2010/0217450 A1* | 8/2010 | Beal et al. | 700/291 |
| 2010/0280978 A1* | 11/2010 | Shimada et al. | 706/12 |
| 2011/0004421 A1* | 1/2011 | Rosewell et al. | 702/45 |
| 2011/0046806 A1* | 2/2011 | Nagel et al. | 700/291 |
| 2011/0046904 A1* | 2/2011 | Souilmi | 702/62 |
| 2011/0066300 A1* | 3/2011 | Tyagi et al. | 700/291 |
| 2011/0095017 A1* | 4/2011 | Steurer | 219/493 |
| 2011/0106328 A1* | 5/2011 | Zhou et al. | 700/291 |
| 2011/0112780 A1* | 5/2011 | Moss | 702/62 |
| 2011/0114627 A1* | 5/2011 | Burt | 219/396 |
| 2011/0153100 A1* | 6/2011 | Besore et al. | 700/291 |
| 2011/0153101 A1* | 6/2011 | Thomas et al. | 700/291 |
| 2011/0191220 A1* | 8/2011 | Kidston et al. | 705/34 |
| 2011/0301894 A1* | 12/2011 | Sanderford, Jr. | 702/65 |
| 2012/0035778 A1* | 2/2012 | Kong | 700/295 |
| 2012/0078547 A1* | 3/2012 | Murdoch | 702/62 |

OTHER PUBLICATIONS

European Search Report from corresponding EP Application No. 11188866.5-1524 dated Feb. 21, 2012.

John W M Cheng et al., "Electric-Load Intelligence (E-LI): Concept and Applications", TENCON 2006 IEEE Region 10 Conference, pp. 1-4, Nov. 1, 2006.

Najmeddine, H. et al., "State of art on load monitoring methods", Power and Energy Conference, pp. 1256-1258, Dec. 1, 2008.

Hsueh-Hsien Chang et al., "Load identification in nonintrusive load monitoring using steady-state and turn-on transient energy algorithms", Computer Supported Cooperative Work in Design (CSCWD), pp. 27-32, Apr. 14, 2010.

* cited by examiner

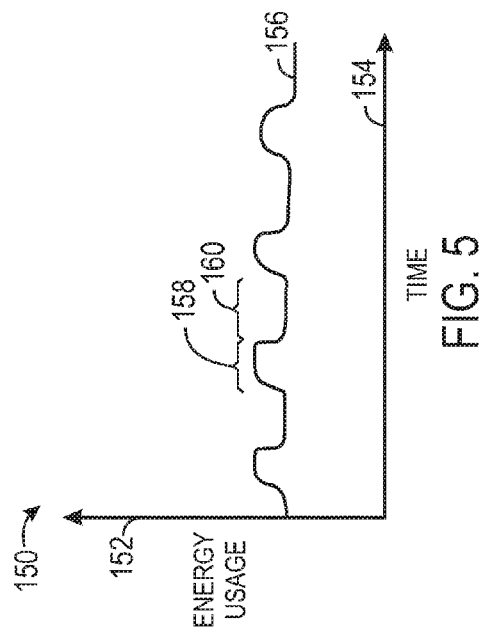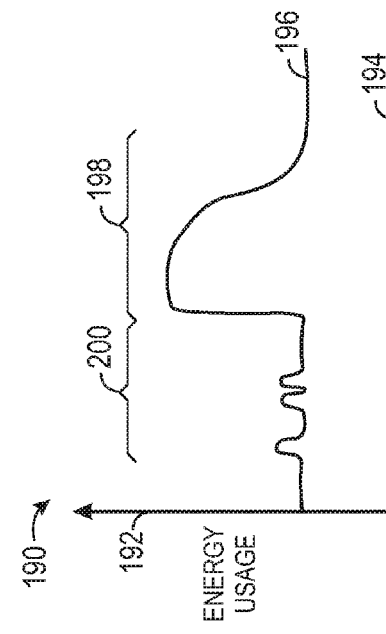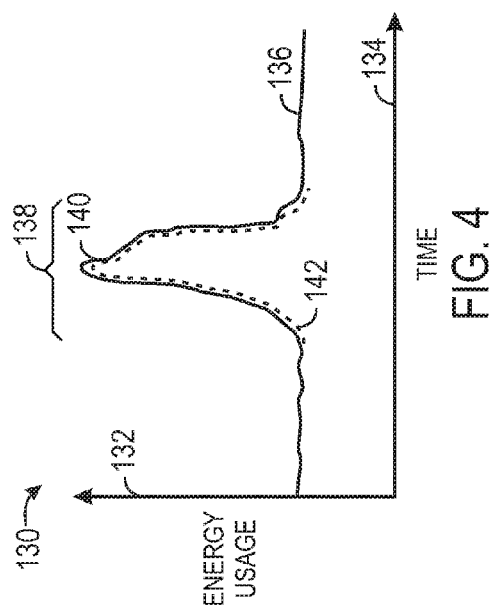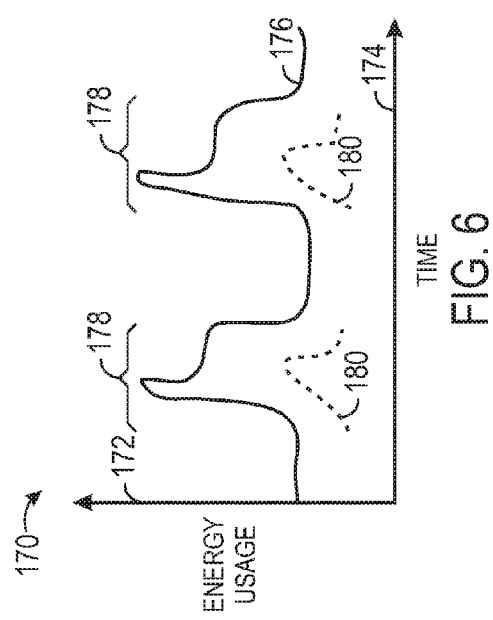

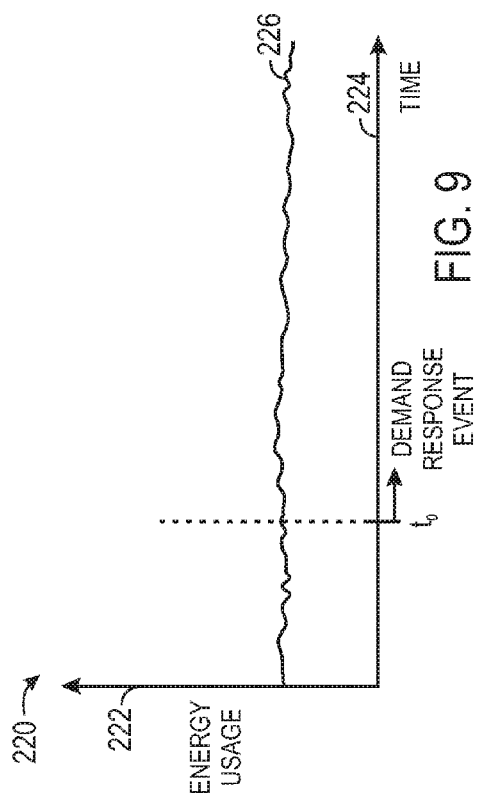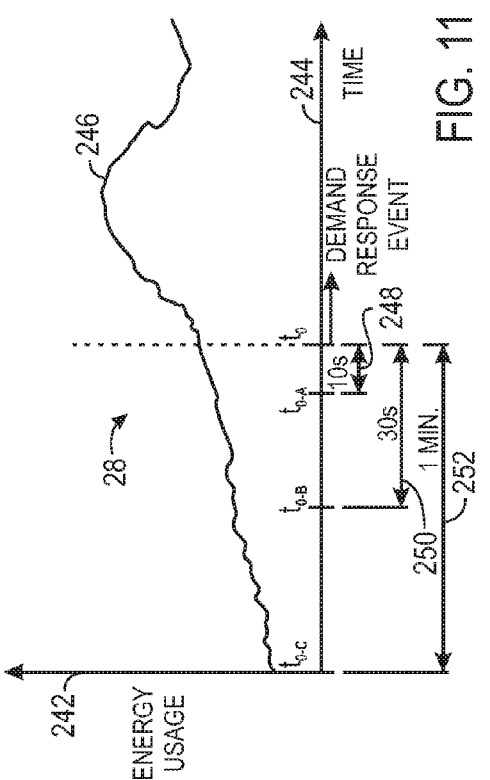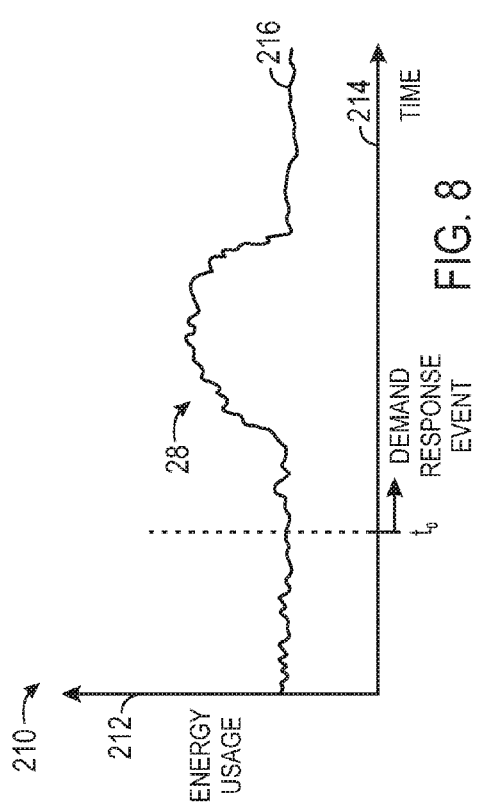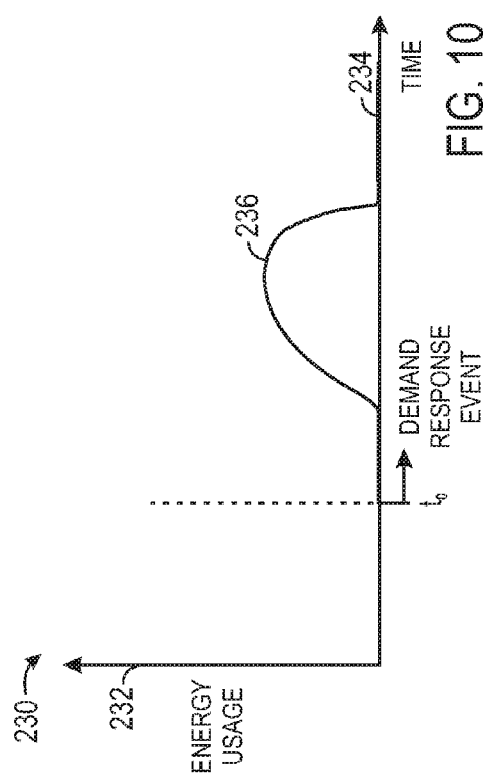

POWER CONSUMPTION COMPLIANCE MONITORING SYSTEM AND METHOD

BACKGROUND OF THE INVENTION

The subject matter disclosed herein relates to monitoring power consumption to verify compliance with a power consumption limitation agreement during a demand response event or agreed period of limited power consumption.

During moments of peak power consumption, a significant strain may be placed on utility providers and the power grid supplying power to consumers. These peak demand periods often occur during the hottest parts of a day, when large numbers of residential and commercial consumers are running heating, ventilation, and air conditioning (HVAC) appliances. In many cases, HVAC appliances may be running at consumers' homes even while the consumers are away. Although a utility provider may desire to offer incentives to consumers to turn off certain high-consumption loads (e.g., HVAC and other appliances) during these peak demand periods, utility providers have lacked the ability to verify whether consumers have complied with a request not to run certain loads at specific times.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a system includes storage containing a load profile representative of a pattern of power consumption by a type of load and data processing circuitry. The data processing circuitry may compare a power usage profile representing power consumption by a consumer at least over a period of time to the load profile to determine whether the consumer is running the type of load over the period of time.

In a second embodiment, an article of manufacture includes one or more tangible, machine-readable media at least collectively having instructions encoded thereon for execution by a processor. These instructions may include instructions to receive a power usage profile representing power consumption by a consumer that took place at least during a demand response event and to receive a load profile representative of a pattern of power consumption by a type of load. The instructions also may include instructions to compare the power usage profile to the load profile and to indicate, when a component of the power usage profile matches the load profile, that the consumer ran the type of load during the demand response event.

In a third embodiment, a method includes receiving a power usage profile (which represents power consumption by a consumer measured by a power meter) before a start of a demand response event and determining whether the power usage profile indicates that the consumer is running a type of load. When the power usage profile indicates that the consumer is running the type of load, the method includes causing an indication to be displayed at the power meter that the type of load has been determined to be running.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIGS. 4-7 represent examples of embodiments of load profiles that may be used to determine whether a user is running a type of load;

FIG. 8 is a plot modeling an embodiment of a power usage sample representing power consumption by a consumer during a demand response event;

FIG. 9 is a plot modeling an embodiment of a baseline component amount of power consumption of the power usage profile of FIG. 8;

FIG. 10 is a plot modeling an embodiment of a component of the power usage profile of FIG. 8 taking place during a demand response event;

FIG. 11 is a plot modeling an embodiment of a power usage profile that includes a power consumption identity code identifying the type of load that is consuming power;

DETAILED DESCRIPTION OF THE INVENTION

Figure 1:
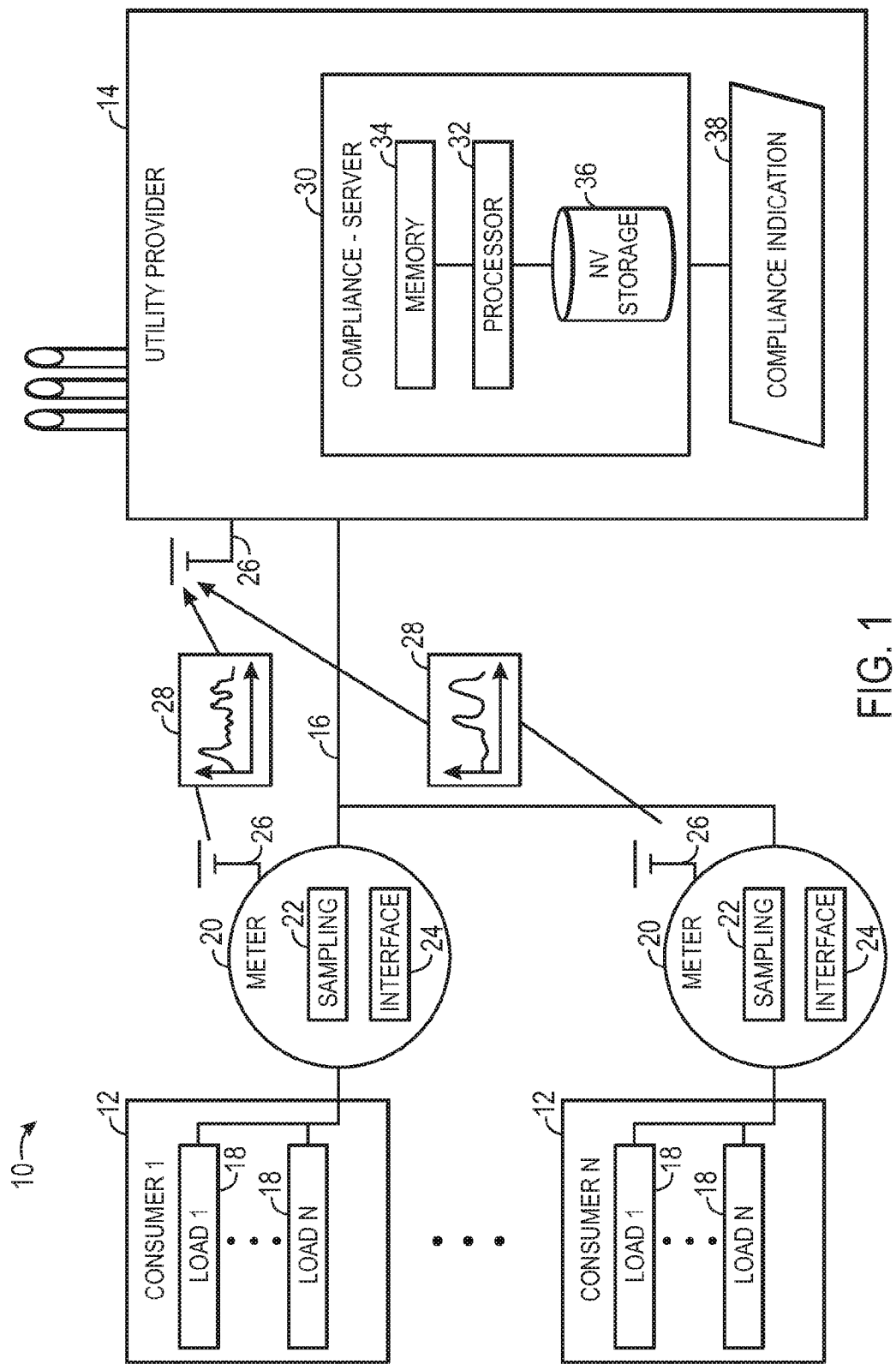
FIG. 1 is a schematic block diagram representing an embodiment of a compliance verification system for determining whether a consumer has complied with a demand response event request.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

As noted above, during peak demand periods, a utility provider may desire to offer incentives to consumers not to run certain loads (e.g., high-power-consuming appliances) to prevent demand from exceeding the available power supply, which may result in power disruptions such as blackouts or brownouts. These peak demand periods often occur during the hottest parts of a day, when large numbers of residential and commercial consumers are running HVAC appliances. As such, the peak demand could be reduced if some of these consumers agreed not to run their HVAC appliances (or other high-power-consumption loads such as charging an electric vehicle) during these peak demand periods. In exchange for agreeing not to run such loads during a demand response event occurring at peak demand periods, a utility provider could offer incentives, such as lower power rates or other benefits. As used herein, a request from a power utility to a consumer not to run a type of load at a certain period of high power demand, so as to mitigate excess power demand, is referred to as a "demand response event request." Such a demand response event request may also be predefined in a contract determining preset times when the consumer is requested not to run certain loads (e.g., certain times of day during certain days or moths of the year when peak load is known to be high). The high power demand period during which a consumer has been requested not to run the type of load may be referred to herein as a "demand response event," but in this disclosure, the term "demand response event" should be understood to refer to any agreed period of limited power consumption.

Without a way to verify consumer compliance during a demand response event, a utility provider may be unaware as to when a consumer agrees not to run a high-power-consumption load (e.g., a high-power-consumption appliance) during a demand response event, but subsequently fails to fulfill their agreement. Accordingly, embodiments of the present disclosure relate to techniques for verifying that a consumer has shut down or has not otherwise run the requested type of load during a demand response event. In particular, according to certain embodiments of the present disclosure, a power meter may sample the power consumption taking place at certain discrete points in time for a period of time that includes the demand response event to obtain a power usage profile. Since different types of loads may consume power according to different patterns of power consumption over time, whether a consumer is running the proscribed type of load may involve comparing this power usage profile to load profiles representing these different patterns of power consumption.

In particular, an electronic device, referred to herein as a "compliance server," may compare the power usage profile to one or more load profiles. When a match is found, it may be understood that the consumer is running the type of load associated with that load profile. Thus, when the power usage profile matches a load profile associated with the type of load the consumer agreed not to run, the utility provider may be made aware that the consumer is not in compliance with the demand response event request.

In addition, when a user has agreed not to run a particular load (e.g., an HVAC system) during a demand response event, but the consumer is running the load before the start of the demand response event, the consumer may be reminded prior to the start of the demand response event. That is, the power meter may sample the power consumption by the consumer over time prior to the start of the demand response event to obtain a power usage profile. The compliance server may compare this power usage profile with one or more load profiles associated with the type of load the consumer as agreed not to run during the demand response event. If the user is not in compliance before the start of the demand response event, the compliance server or the utility provider may notify the consumer of their current non-compliance, enabling the consumer to prepare for the demand response event by shutting off the type of load as previously agreed.

With the foregoing in mind, FIG. 1 represents a demand response event compliance verification system 10. In the system 10, consumers 12 may receive power from a utility provider 14 via a power grid of alternating current (AC) power lines 16. The power grid 16 may supply power to any suitable number of consumers 12, here labeled 1-N. These consumers 12 may represent, for example, residential or commercial consumers of power or those paying utility bills for combined electric usage for end consumers (e.g., commercial building owners, condo associations, and so forth), each of which may consume power by running a number of loads 18. The consumers 12 may include natural persons, business entities, commercial or residential properties, equipment, and so forth. The loads 18 may include, for example, certain relatively high-power-consuming loads 18, such as HVAC appliances, pool pumps, cooking appliances (e.g., ovens, ranges, cooktops, microwave ovens, etc.), laundry machines (e.g., clothes washers and dryers), refrigerators and freezers, electric vehicles being charged, industrial equipment (e.g., pumps and motors) and so forth, as well as certain relatively low-power-consuming loads 18, such as televisions, computers, and lights. As shown in FIG. 1, each consumer 12 may be running 1-N loads 18 at any given point in time.

A local power meter 20 may track the amount of power consumed by each consumer 12. Each power meter 20 may include sampling circuitry 22 and a consumer interface 24, and certain communication circuitry 26 with which the power meter 20 may communicate with the utility provider 14. During periods of peak power demand, or a "demand response event," the utility provider 14 may desire to offer incentives to the consumers 12 in exchange for refraining from running certain high-power-consuming loads 18 in a "demand response event request." The utility provider 14 may communicate such a request to the consumer 12 via, for example, text messaging, phone, website, email, and/or the interface 24 of the meter 20 by way of the communication circuitry 26. When a consumer 12 agrees to such a demand response event request, the utility provider 14 may verify subsequent compliance during the demand response event using the demand response event compliance verification system 10. In addition, it should be understood that in some embodiments, a load 18 may include a built-in demand response system, which may automatically respond to a demand response event request from a utility provider 14 by powering the load 18 off or refusing to turn the load 18 on during a demand response event.

Specifically, at least while the demand response event is occurring, the sampling circuitry 22 of power meters 20 of consumers 12 that have agreed with the demand response event request may sample discrete power consumption by the consumers 12 to obtain power usage profiles 28. For example, the sampling circuitry 22 may measure the instantaneous current power consumption or change in power consumption at specific intervals (e.g., every 0.1, 0.2, 0.5, 1, 2, 5, 10, 20, or 30 seconds, or every 1, 2, or 5 minutes, or other such intervals). In at least one embodiment, the sampling circuitry 22 samples the current power consumption of the consumer 12 at an interval long enough to provide privacy, such that relatively low-power-consuming loads 18 generally are not particularly detectable according to the techniques discussed herein, but such that relatively high-power-consuming loads 18 are detectable (e.g., approximately every 5-10 seconds or longer). The power meters 20 may communicate these power usage profiles 28 via the communication circuitry 26. This communication circuitry 26 may include wireless communication circuitry capable of communicating via a network such as a personal area network (PAN) such as a Bluetooth network, a local area network (LAN) such as an 802.11x Wi-Fi network, a wide area network (WAN) such as a 3G or 4G cellular network (e.g., WiMax), and/or a power line data transmission network such as Power Line Communication (PLC) or Power Line Carrier Communication (PLCC).

A compliance server 30 associated with the utility provider 14 may receive the power usage profiles and determine whether the consumers 12 have complied with the demand response event request. Although the compliance server 30 is illustrated as being associated with the utility provider 14, the compliance server 30 may be associated instead with a third party service, or may represent a capability of the power meter 20. The compliance server 30 may include a processor 32, memory 34, and storage 36. The processor 32 may be operably coupled to the memory 34 and/or the storage 36 to carry out the presently disclosed techniques. These techniques may be carried out by the processor 32 and/or other data processing circuitry based on certain instructions executable by the processor 32. Such instructions may be stored using any suitable article of manufacturer, which may include one or more tangible, computer-readable media to at least collectively store these instructions. The article of manufacturer may include, for example, the memory 34 and/or the nonvolatile storage 36. The memory 34 and the nonvolatile storage 36 may include any suitable articles of manufacturer for storing data and executable instructions, such a random-access memory, read-only memory, rewriteable flash memory, hard drives, and optical disks.

Using techniques such as those described herein, the compliance server 30 may compare the power usage profiles 28 received from the power meters 20 with various load profiles, which may be stored in the storage 36 and which may represent patterns of power consumption by certain types of loads 18. If the compliance server 30 determines that a power usage profile 28 matches a load profile associated with the type of load the consumer 12 agreed not to run, the compliance server 30 may output a compliance indication 38 indicating that the consumer 12 has not complied with the demand response event request. If the compliance server 30 does not determine that the power usage profile 28 matches a load profile from the nonvolatile storage 36 that represents a type of device that has been agreed not to be run during a demand response event, the compliance server 30 may output the compliance indication 38 to indicate that the consumer 12 is in compliance with the demand response event request.

Figure 2:
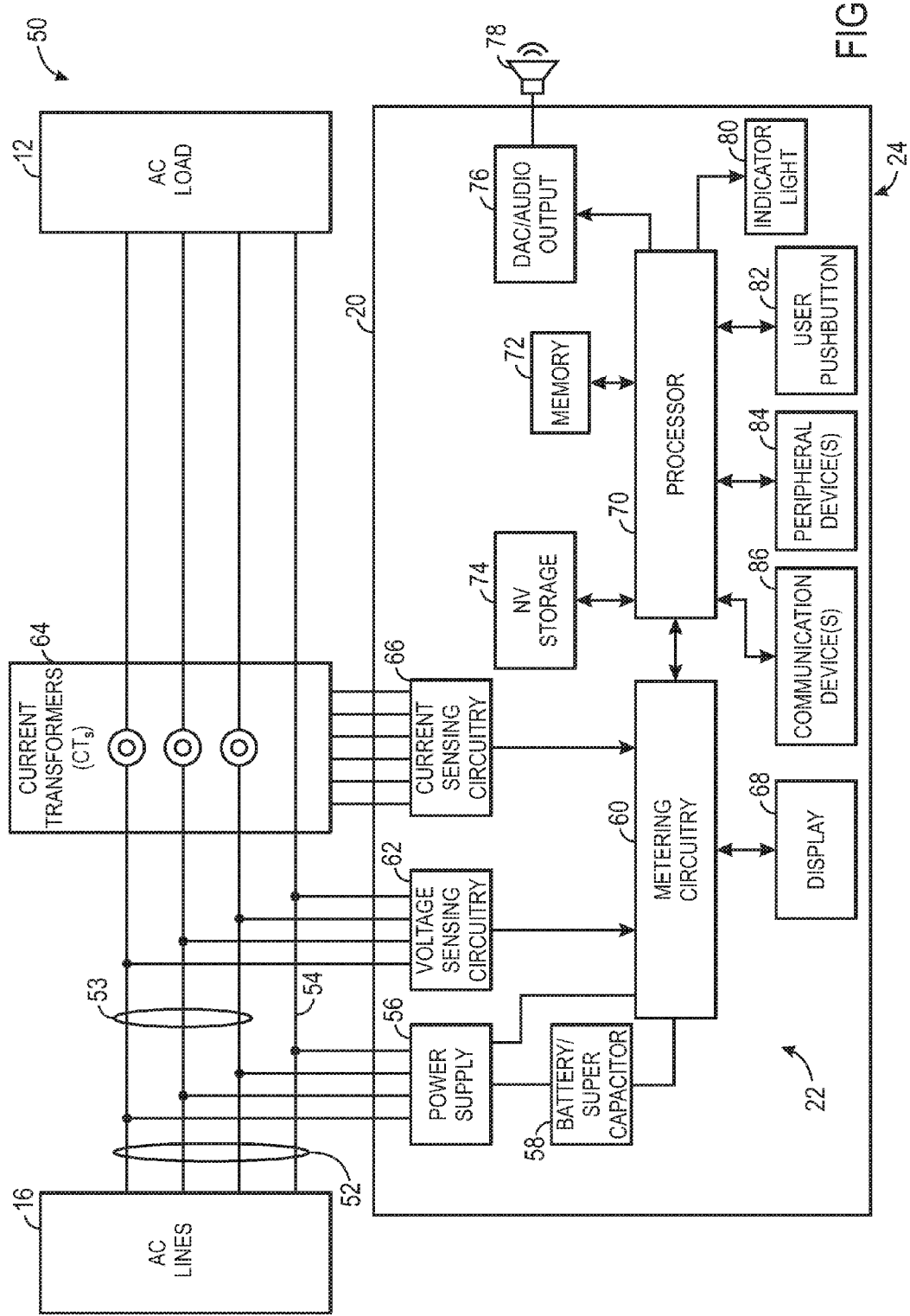
FIG. 2 is a schematic block diagram representing an embodiment of a power meter that may sample consumer power consumption for compliance verification.

The power meters 20 may take a variety of forms. One embodiment of a three-phase power meter 20 appears in FIG. 2 in a power meter system 50 as joined to the power grid 16, as power flows from AC lines 52 to an AC load 12 (e.g., a residential or commercial establishment owned by a consumer 12 running any suitable number of loads 18). Although the embodiment of FIG. 2 involves monitoring three-phase power, alternative embodiments of the power meter 20 may monitor single-phase power. In the illustrated embodiment, the AC lines 52 may transmit three-phase power via three phase lines 53 and a neutral line 54. The power meter 20 may obtain power via power supply circuitry 56 that may couple to the three phase lines 53 and the neutral line 54 for its internal power consumption. To back up power consumption data in the event of a power outage, the power supply circuitry 56 also may charge a battery and/or super capacitor 58. In alternative embodiments, the backup power may be fed by a non-rechargeable battery.

Metering circuitry 60 may ascertain power consumption by monitoring the voltage and current traversing the AC lines 52 to the AC load 12. In particular, voltage sensing circuitry 62 may determine the voltage based on the three phase lines 53 and the neutral line 54. Current transformers (CTs) 64 and current sensing circuitry 66 may determine the current flowing through the three phase lines 53. The metering circuitry 60 may output the current power consumption values to an electronic display 68, such as a liquid crystal display (LCD), as well as to a processor 70. The metering circuitry 60 may sense the voltage and current inputs and send corresponding pulses to the processor 70, which calculates various data relating to the current power consumption of the consumer 12. For example, the processor 70 may calculate the energy accumulation, power factor, active power, reactive power and maximum demand, etc. These various elements may collectively form the sampling circuitry 22 that determines the power usage profile 28 representing power consumption by the consumer 12.

The processor 70 may store the demand details in memory 72 and/or nonvolatile storage 74, which may be NVRAM (EEPROM) or other suitable nonvolatile storage, such as the nonvolatile storage discussed above in relation to the compliance server 30. In certain embodiments, multiple functions of the power meter 20 may be implemented in a single chip solution, in which a single chip performs both the voltage/current sensing and the calculation of demand parameters. From the demand data in the processor 70, the processor 70 may generate the power usage profile 28. Certain audio alerts may be provided by the processor 70 to audio output circuitry 76 and/or 78, which may include a digital-to-analog converter (DAC) and a built-in speaker or external powered speakers connected by the consumer 12. These audio alerts may include, for example, an indication that the utility provider 14 has sent a demand response event request, or a reminder to shut off a load 18 during a demand response event.

The processor 70 may include one or more microprocessors, such as one or more "general-purpose" microprocessors, one or more application-specific processors (ASICs), or a combination of such processing components, which may control the general operation of the power meter 20. For example, the processor 70 may include one or more instruction set processors (e.g., RISC), audio processors, and/or other related chipsets. The memory 72 and the nonvolatile storage 74 may store the current and/or certain historical power consumption values, as well as provide instructions to enable the processor 70 to generate the power usage profile 28.

The processor 70 may be operably coupled to the memory 72 and/or the storage 74 to carry out the presently disclosed techniques. These techniques may be carried out by the processor 70 and/or other data processing circuitry based on certain instructions executable by the processor 70. Such instructions may be stored using any suitable article of manufacturer, which may include one or more tangible, computer-readable media to least collectively store these instructions. The article of manufacturer may include, for example, the memory 72 and/or the nonvolatile storage 74. The memory 72 and the nonvolatile storage 74 may include any suitable articles of manufacturer for storing data and executable instructions, such a random-access memory, read-only memory, rewriteable flash memory, hard drives, and optical disks To interface with the consumer 12, the processor 70 may cause an indicator light 80 to blink or flash or may display messages on the display 68. By way of example, such a message may include a demand response event request or a reminder to comply with a demand response event request. The consumer 12 may respond by pressing a user pushbutton 82 or via a peripheral device 84, such as a computing device (e.g., computer or portable phone) or an input device (e.g., a keyboard or touch-sensitive screen). These components of the power meter 20, including the display 68 and the audio output circuitry 76 and/or 78, generally may represent the interface circuitry 24 of the power meter 20. The communication circuitry 26 is represented as communication device(s) 86 in FIG. 2, which may include interfaces for a personal area network (PAN) such as a Bluetooth network, a local area network (LAN) such as an 802.11x Wi-Fi network, a wide area network (WAN) such as a 3G or 4G cellular network (e.g., WiMax), an infrared (IR) communication link, a Universal Serial Bus (USB) port, and/or a power line data transmission network such as Power Line Communication (PLC) or Power Line Carrier Communication (PLCC).

Figure 3:
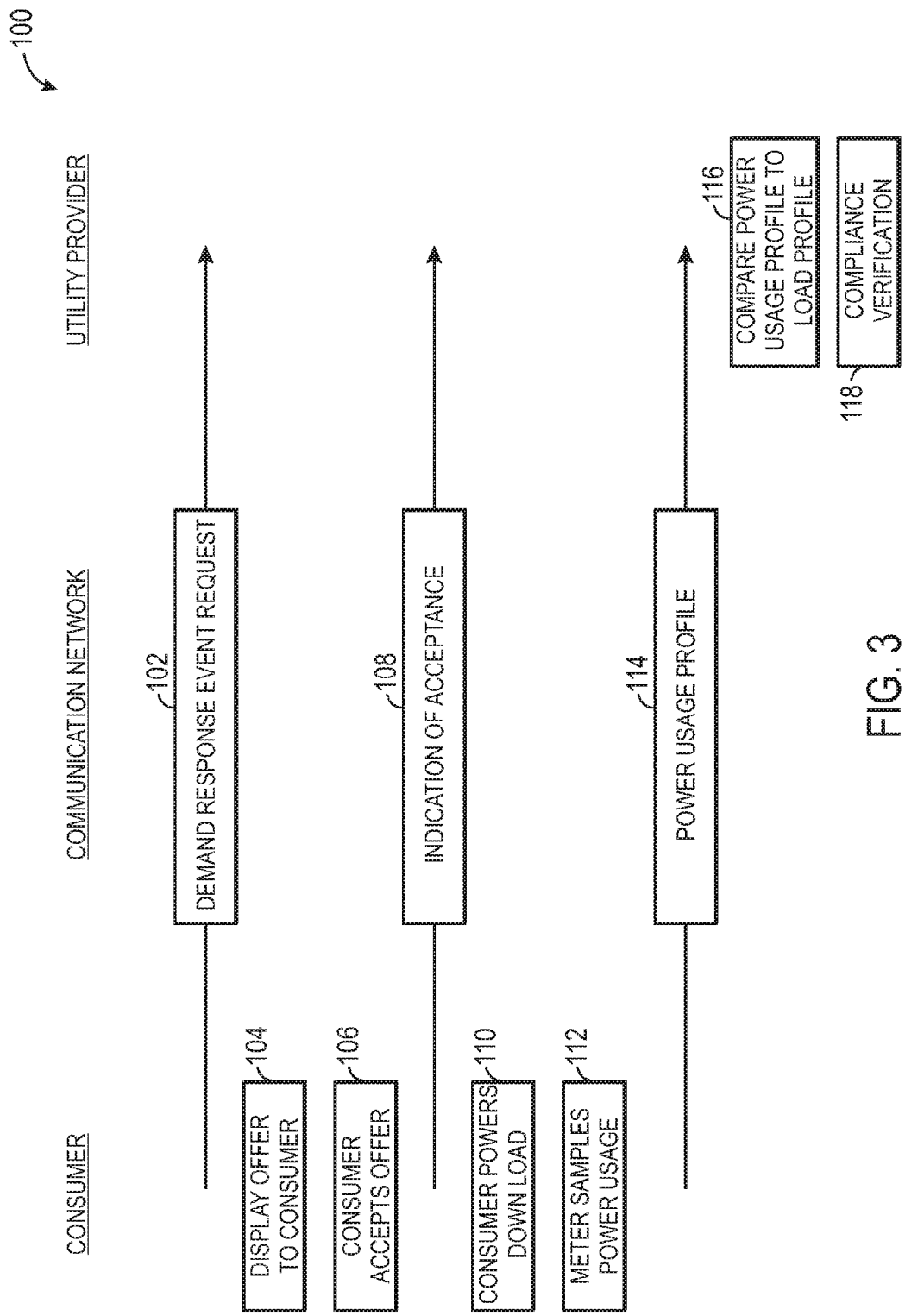
FIG. 3 is a communication diagram representing an embodiment of communication that may take place between a utility provider and a consumer relating to a demand response event request.

One embodiment of communication 100 that may take place between a consumer 12 and the utility provider 14 appears in FIG. 3. Specifically, the utility provider 14 may initially issue a demand response event request (block 102) asking the consumer 12 not to run a type of load 18 (e.g., a high-power-consuming appliance such as an HVAC or charging an electric vehicle) during a demand response event where power demand is expected to be excessively high. The utility provider 13 may issue the demand response event request of block 102 via any suitable network. The consumer 12 may receive the demand response event request of block 102 at the interface circuitry 24 of the power meter 20, or via some other communication with the consumer 12, such as via text message, phone, email, a website, etc. When the demand response event request of block 102 is sent to the power meter 20, the power meter 20 may display the offer to the consumer 12 (block 104) on the display 68 of the power meter 20.

The consumer 12 may accept the offer of the demand response event request of block 102, for example, by interacting with the interface 24 of the power meter 20 or by replying to the text message, phone, email, or website. When the consumer 12 accepts the offer (block 106), an indication of acceptance (block 108) may be sent to the utility provider 14. When the consumer 12 accepts the demand response event request of block 102 by indicating agreement via the interface 24 of the power meter 20, the power meter 20 may transmit the indication of acceptance of block 108 via the communication device(s) 84. When the consumer 12 accepts the demand response event request of block 102 by indicating agreement via a text message, phone, email, a website, etc., the utility provider 14 may communicate to the power meter 20 that the consumer 12 has accepted the demand response event request of block 102.

When the start of the demand response event approaches, the consumer 12 may power down the load 18 per the agreement of the demand response event request (block 110). Thereafter, at least during the demand response event, the power meter 20 may sample consumer 12 power usage to obtain a power usage profile 28 (block 112). The power meter 20 may communicate this power usage profile 28 via the communication network to the compliance server 30 associated with the utility provider 14 (block 114), which may compare the power usage profile 28 to various load profiles (block 116). Since the consumer 12 has powered down the load 18 per the demand response event request agreement, the compliance server 30 will not find a match between the load profiles representing the type of load the consumer 12 agreed not to run and the power usage profile 28, and thus compliance may be verified with a compliance indication 38 (block 118). On the other hand, if the consumer 12 had not powered down the load 18 in block 110, when the power usage profile 28 is compared to the various load profiles in block 116, a match may found and the utility provider 14 may be alerted as to the noncompliance of the consumer 12. Such a situation is described further below.

As noted above, different types of loads 18 typically may consume power according to different patterns. For example, an HVAC system may consume power according to a different pattern than would a clothes dryer, a refrigerator, or an oven. FIGS. 4-7 represent various exemplary plots modeling load profiles, which represent patterns of power consumption typical to certain types of loads 18. It should be appreciated that the plots of FIGS. 4-7 are intended only to be representative of the general type of load profiles that may be stored in the nonvolatile storage 36 of the compliance server 30. In practice, the various load profiles are measured empirically and may include varying levels of detail to distinguish between broad classes of loads 18 (e.g., HVAC systems, ovens, clothes dryers, refrigerators, electric vehicles, industrial motors, and so forth) or even to distinguish between specific brands or even models of certain loads 18 (e.g., an oven by General Electric Company, an HVAC system by General Electric Company, and so forth). It should also be understood that any suitable format may convey the information presented by load profiles such as those shown in FIGS. 4-7. For example, the load profiles may be represented by vector data or delta values that indicate change in power consumption over time.

A plot 130 shown in FIG. 4 represents a load profile associated with a clothes dryer. An ordinate 132 represents energy usage and an abscissa 134 represents time. A real power consumption curve 136 illustrates the general manner in which a clothes dryer may consume power over time, increasing during an active period 138 and reaching a peak 140 before relatively rapidly returning to a baseline level of power consumption. As shown in the plot 130, reactive effects 142 caused by a clothes dryer generally may track the real power consumption curve 136.

A plot 150 shown in FIG. 5 generally represents a load profile associated with a refrigerator. In the plot 150, an ordinate 152 represents energy usage and abscissa 154 represents time. A real power consumption curve 156 illustrates that, during active periods 158 when the refrigerator is actively discharging heat, power consumption may be moderately higher than a baseline occurring during an inactive period 160, when the refrigerator is temporarily drawing less power.

A plot 170 shown in FIG. 6 represents a load profile associated with an HVAC system. An ordinate 172 represents energy usage, while an abscissa 174 represents time. A real power consumption curve 176 represents power consumption of an HVAC system taking place over time. During active periods 178, the HVAC system may draw significant amounts of power, as shown in the plot 170. At these times, the certain reactive effects 180, which do not necessarily track the real power consumption curve 176, may be detectable.

In addition to consuming power according to a specific pattern, the power consumption patterns of some loads may include a power consumption code identifying the type of load. An embodiment of a load profile associated with such a load 18 appears in a plot 190 of FIG. 7. In the plot 190, an ordinate 192 represents energy usage, while an abscissa 194 represents time. A power consumption curve 196 represents real power consumption by a load 18 (e.g., an appliance) capable of self-identifying through a power consumption code. In FIG. 7, the load 18 is an oven capable of self-identifying through a power consumption code. During an active period 198, the energy consumption of the load 18 may begin at a relatively high level of power consumption, gradually returning to a baseline level of power consumption. In addition, when the load 18 begins to become activated, or just before the load 18 becomes activated, the load 18 may emit a power consumption identity code 200. This power consumption identity code 200 may include a series of pulses of energy consumption, which may specifically identify the load 18 as being in a specific class of appliances (e.g., that the load 18 is an oven), or even identifying the specific brand of the appliance (e.g., that the load 18 is an oven by General Electric Company). By way of example, the power consumption identity code 200 may enable identification of the load 18 based on the number, amplitude, or spacing of pulses. The power consumption identity code 200 may provide an indication of an appliance type, manufacturer, model number, age, and so forth. It should be appreciated that loads 18 may be sold having such a power consumption identity code 200 programmed thereon (e.g., as machine readable instructions on a suitable article of manufacture, such as a read only memory, random access memory, flash memory, and so forth).

As noted above, the compliance server 30 may compare a power usage profile 28 measured by a power meter 20 with various load profiles, such as those represented by the plots of FIGS. 4-7. As should be appreciated, the load profiles and/or the power usage profile 28 may be represented in a variety of forms. Such forms may include a series of discrete numerical data points, indications of changes from one point in time to another point in time, mathematical relationships or equations, or vector representations of the power consumption, to name only a few. It should be appreciated that the power usage profiles 28 and/or load profiles may take any other suitable form to enable their comparison to detect when an appliance is running for compliance verification purposes. Load profiles, such as those represented and suggested by the examples of FIGS. 4-7, may be stored as machine readable instructions on a suitable article of manufacture, such as a read only memory, random access memory, flash memory, and so forth. Individual load profiles or collections of load profiles may be sold to utility providers 14 to enable the utility providers to verify when consumers 12 are in compliance with a demand response event.

The compliance server 30 may compare the power usage profile 28 to the load profiles after performing certain processing generally isolate the components of the power usage profile due to high-power-consuming loads 18. For example, FIGS. 8-10 illustrate one manner of removing certain baseline power consumption of the power usage profile 28 due to relatively low-power-consuming loads 18, before comparing the remaining components of the power usage profile 28, due to the high-power-consuming loads 18, to one or more load profiles.

Turning to FIG. 8, a power usage profile 28 shown by a plot 210 is unlikely to represent power consumption caused exclusively by a single load 18. Specifically, a consumer 12 may be running any number of loads 18, only one of which may be a type of load 18 that the utility provider 14 has requested the consumer 12 not run during a demand response event. For example, a user may be running relatively low-power-consuming loads 18, such as a television, a computer, lights, and so forth, in addition to other relatively high-power-consuming loads 18. A baseline level of power consumption due to these loads 18 may be present prior to the start of the demand response event.

The plot 210 of FIG. 8 includes an ordinate 212 representing energy usage and an abscissa 214 representing time, which encompasses a period of time both before and after the start of a demand response event at a time $t_0$. A power consumption curve 216 may include the sum of all power consumed by loads 18 run by the consumer 12. As such, the power usage profile 28 shown in the plot 210 may include a certain level of baseline noise resulting from many different relatively low-power-consuming loads 18.

Such a baseline amount of power consumption is represented by a plot 220 of FIG. 9. In the plot 220, an ordinate 222 represents energy usage, and an abscissa 224 represents time, including a period of time before and after the start of the demand response event at time $t_0$. A power consumption curve 226 represents the baseline amount of power consumption occurring in the power usage profile 28 represented by the plot 210 of FIG. 8. By way of example, the baseline power consumption curve 226 may be based on the period of time just prior to time $t_0$ (e.g., 10 s, 30 s, 1 min., 2 min., 5 min., 10 min., 20 min., 30 min., 1 hour, etc.) the demand response event begins, or may be determined by estimating a likely amount of baseline power consumption (e.g., through empirically measured averages of power consumption by a typical consumer 12 or the same consumer 12), or may be determined based on historical power usage by the specific consumer 12 to which the power usage profile 28 belongs, for example.

Since this baseline level of power consumption generally only may reflect power consumed by relatively low-power-consuming loads 18, such a baseline power consumption curve 226 may be subtracted from the power usage profile of power consumption curve 216 of the plot 210 of FIG. 8 to obtain a plot 230 of FIG. 10. The plot 230 may include an ordinate 232 representing energy usage and abscissa 234 representing time, which represents time before and after the start of a demand response event at time $t_0$. A revised power consumption curve 236 represents power consumption due to relatively high-power-consuming loads 18, which may be of particular interest during a demand response event. This power consumption curve 236 may be compared in the compliance server 30 to one or more load profiles until a match is found that identifies the type of loads 18 that the consumer 12 is running during the demand response event. From such comparisons, the compliance server 30 may identify whether the consumer 12 is running a type of load that the consumer 12 has agreed not to run.

In another embodiment, the baseline power consumption of a power usage profile 28 may be determined based on typical power consumption occurring during several different periods prior to the start of a demand response event. For example, as shown by a plot 240 of FIG. 11, which includes an ordinate 242 representing energy usage and an abscissa 244 representing time, including times before and after the start of a demand response event at time $t_0$, a variety of baselines may be developed to compare to a power consumption curve 246. More than one baseline component may be subtracted from the power consumption curve 246, such as a first baseline component 248 determined as occurring between a time $t_{0-A}$ and $t_0$. This first baseline component 248 may be relatively shorter than other baseline components to be determined (e.g., the first baseline component 248 may last approximately 10 s). A second baseline component 250 may be determined as occurring between $t_{0-B}$ to $t_0$, and may last, for example, approximately two or more times as long as the first baseline component (e.g., approximately 30 seconds). A third baseline component 252 may be determined between $t_{0-C}$ and $t_0$, and may last approximately two or more times longer than the second baseline component 250 (e.g., 1 min.). In one embodiment, these various baseline components 248, 250, and 252 may be averaged to produce a single average baseline component that may be subtracted from the component of the power consumption curve 246 occurring during the demand response event. In another embodiment, the baseline components 248, 250, and 252 may be separately subtracted from the power consumption curve 246 to produce three distinct revised power usage profiles 28 that may be compared to the load profiles in the compliance server 30.

Figure 12:
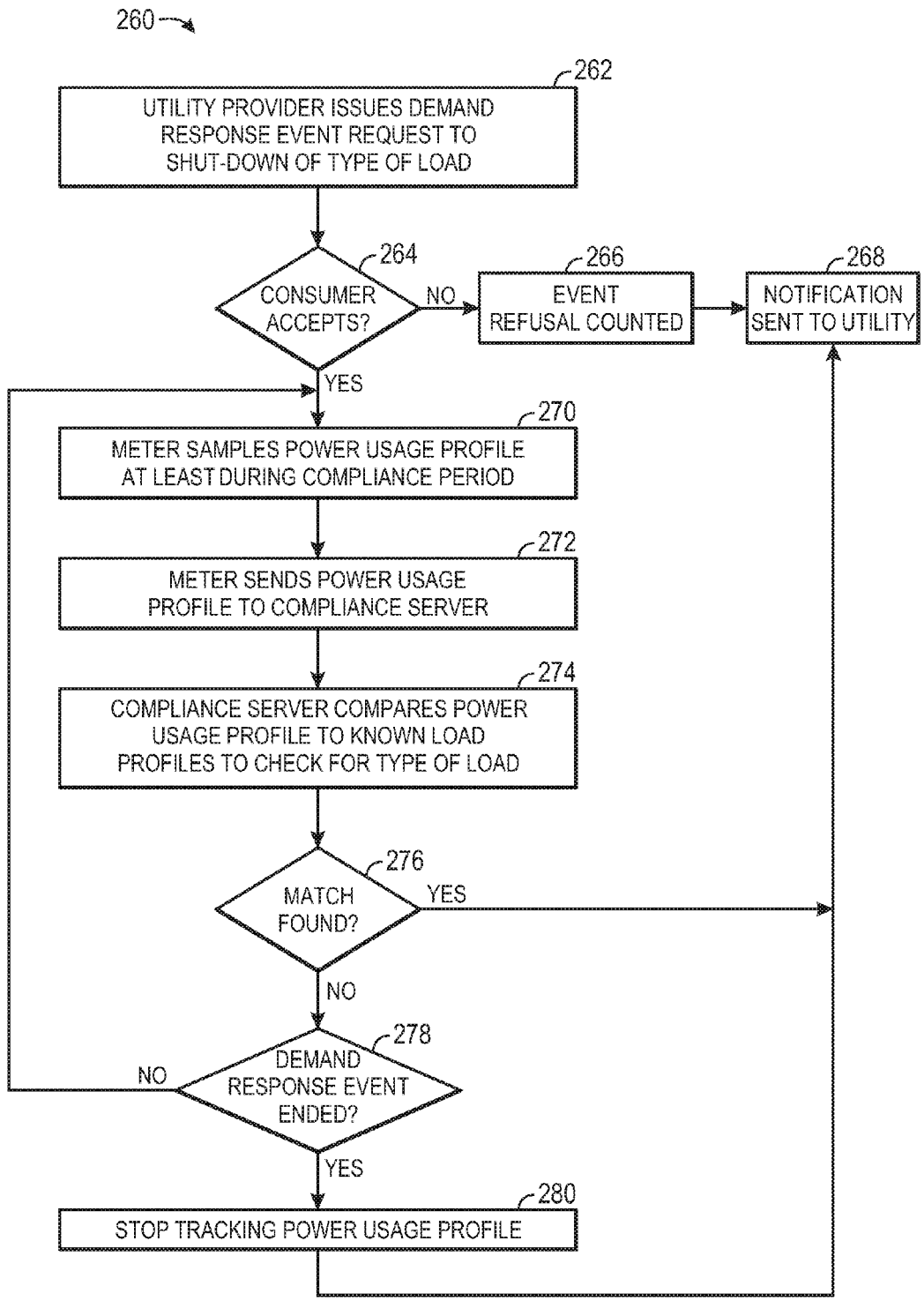
FIG. 12 is a flowchart describing an embodiment of a method for issuing a demand response event request and monitoring for consumer compliance.

FIG. 12 represents a flowchart 260 that describes a method for carrying out the techniques discussed above. The flowchart 260 may begin when the utility provider 14 issues a demand response event request to a consumer 12, asking the consumer 12 to shut down a specific type of load 18 during a demand response event (block 262). If the consumer 12 does not accept the demand response event request (decision block 264) this refusal may be detected and counted (e.g., by the power meter 20) (block 266) and a corresponding notification sent to the utility provider 14 (block 268).

If the consumer 12 does accept the demand response event request (decision block 264), the power meter 20 may sample the current power consumption of the consumer 12 to obtain a power usage profile during at least the compliance period of the demand response event (block 270). The power meter 20 may send the power usage profile 28 determined in block 270 to a compliance server 30 associated with the utility provider 14 (block 272). Thereafter, the compliance server 30 may compare the power usage profile to various known application profiles stored in the nonvolatile storage 36, which may indicate the types of loads that the consumer 12 is running (block 274). If a match is found (decision block 276), the consumer 12 may be understood to be in noncompliance with the demand response event request, and a notification indicating such may be sent to the power utility 14 (block 268). On the other hand, if no match is found (decision block 276), and the demand response event has not yet ended (decision block 278), the actions of blocks 270-276 may continue. When the demand response event has ended (decision block 278), the power meter 20 may stop tracking the power usage profile 28 of the consumer 12 (block 280), and a notification indicating that the user remained in compliance during the demand response event may be sent to the power utility 14 (block 268).

Figure 13:
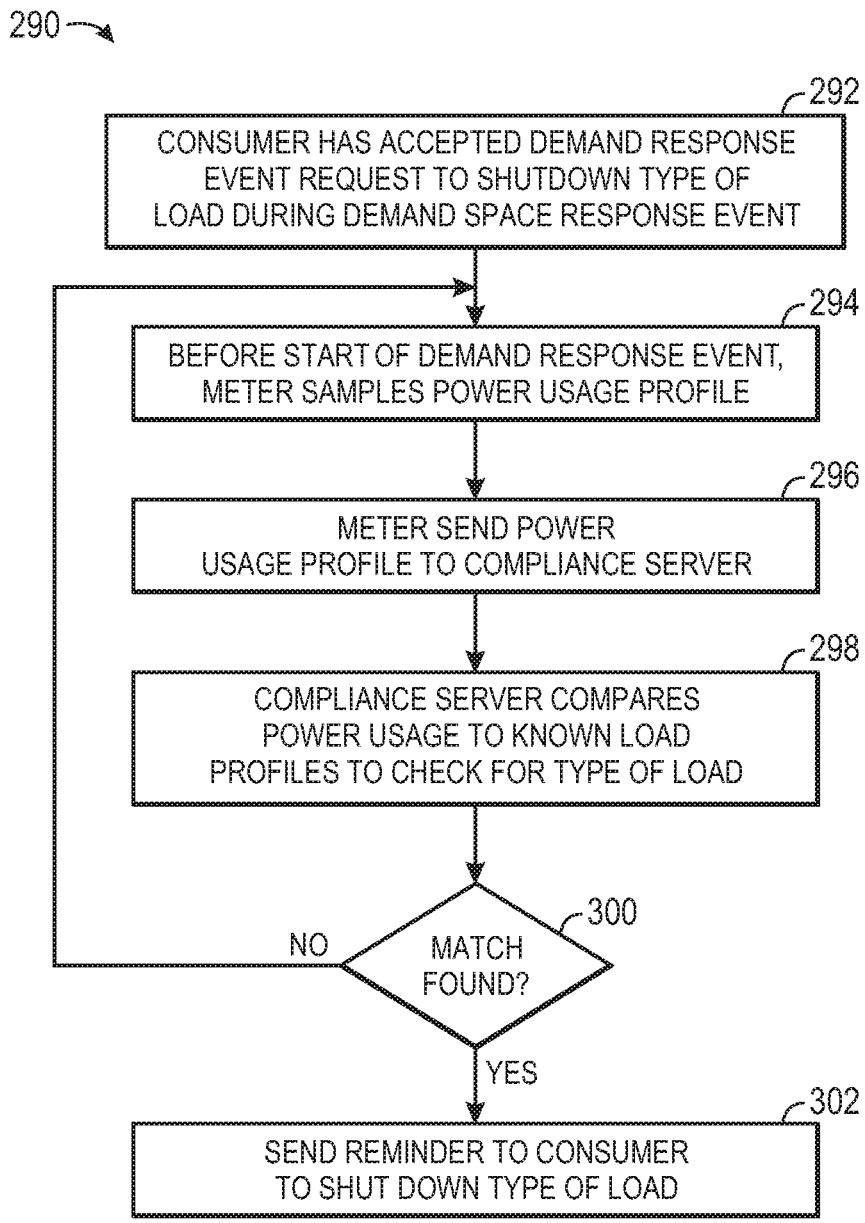
FIG. 13 is a flowchart describing an embodiment of a method for reminding a consumer of a demand response event request when the user is currently in non-compliance before the demand response event.

At times, when a demand response event is about to occur, a consumer 12 may be temporarily in noncompliance with a demand response event request. For example, a consumer 12 may be running the type of load 18 the consumer 12 agreed not to run during the demand response event), and might otherwise continue to run the load 18 by accident without a reminder. Thus, a flowchart 290 of FIG. 13 represents an embodiment of a method for reminding a consumer 12 of current noncompliance, so that the consumer 12 may shut down the promised load 18 and may be in compliance with the demand response event request when the demand response event occurs.

The flowchart 290 may begin after a consumer 12 has accepted a demand response event request from a utility provider 14 to shut down a specific type of load during a demand response event (block 292). During some period of time before the demand response event begins, the power meter 20 may sample the power usage profile of the consumer 12 (block 294) and send such power usage profile 28 to the compliance server 30 (block 296). Thereafter, the compliance server 30 may compare the power usage profile to the known load profiles stored in nonvolatile storage 36 associated with the compliance server 30, specifically seeking the type of load 18 that the consumer 12 has agreed not to run during the demand response event (block 298). If a match is not found (decision block 300), the actions of blocks 294-298 may continue until the start of the demand response event. However, if a match is found (decision block 300), indicating that the consumer 12 is currently running the type of load 18 that the consumer 12 agreed not to run (decision block 300), a reminder may be sent to the consumer 12 reminding the consumer 12 to shut down the previously agreed upon load 18 before the start of the demand response event (block 302).

Technical effects of the invention include enabling a manner of detecting compliance with a demand response event request, when a consumer has been requested not to run a specific type of load during periods of peak power consumption. Thus, a utility provider may offer incentives to consumers to refrain from running certain loads (e.g., high-power-consuming appliances) during such periods of peak power consumption, when the strain of such power consumption could result in service interruptions. Additionally, a utility provider may be able to detect the types of loads a consumer has chosen to run at any given point in time according to the techniques discussed above.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A utility meter system comprising:
an electronic interface configured to provide to a consumer a request not to run a particular type of power-consuming device during a forthcoming demand response event in exchange for an incentive, wherein the particular type of power-consuming device is configured to be prevented from running by the consumer rather than an external entity during the demand response event;
power sampling circuitry configured to obtain a power usage profile representing total power consumed over time by all power-consuming devices on consumer premises run by the consumer for a period of time, wherein the period of time includes at least the demand response event when the consumer has agreed not to run the particular type of power-consuming device during the demand response event and ends approximately when the demand response event ends; and
communication circuitry configured to provide the power usage profile but not an express status of the particular type of power-consuming device to an external entity to enable the external entity to determine whether the consumer complied with the agreement not to run the particular type of power-consuming device during the demand response event;
wherein the power usage profile represents power consumption by the consumer at a plurality of specific points in time over the period of time.

2. The system of claim 1, wherein the power usage profile represents power consumption by the consumer every 5 seconds or longer to preserve consumer privacy.

3. The system of claim 1, wherein the power usage profile comprises two-dimensional vectors.

4. The system of claim 1, wherein the power usage profile comprises raw power consumption values relative to time.

5. The system of claim 1, wherein the power usage profile represents real and reactive power consumption.

6. The system of claim 1, wherein the external entity comprises a utility.

7. The system of claim 1, wherein the communication circuitry is configured to receive from the external entity the request not to run the particular type of power-consuming device during the demand response event.

8. The system of claim 1, wherein:
the interface is configured to receive a user indication of agreement or disagreement with the request; and
the communication circuitry is configured to communicate the indication of agreement or disagreement with the request to the external entity.

9. An article of manufacture comprising:
one or more tangible, non-transitory machine-readable media at least collectively having instructions encoded thereon for execution by a processor, the instructions comprising:
instructions to issue a request to a consumer not to run a particular type of power-consuming device during a forthcoming demand response event, wherein the particular type of power-consuming device is configured to be prevented from running by the consumer rather than an external entity during the demand response event;
instructions to receive an indication of whether the consumer has agreed not to run the particular type of power-consuming device during the demand response event;
instructions to receive, when the indication indicates that the consumer has agreed not to run the particular type of power-consuming device during the demand response event, a power usage profile representing total power consumption over a time period by all power-consuming devices on consumer premises run by the consumer over at least the demand response event, wherein the time period ends at approximately the same time as the demand response event; and
instructions to determine whether the consumer ran the particular type of power-consuming device during the demand response event by analyzing the power usage profile for a time-dependent pattern indicative of the particular type of power-consuming device;
wherein the power usage profile represents power consumption by the consumer at a plurality of specific points in time over the period of time.

10. The article of manufacture of claim 9, wherein the particular type of power-consuming device comprises a general class of appliance identifiable from the time-dependent pattern in the power usage profile.

11. The article of manufacture of claim 9, wherein the particular type of power-consuming device comprises a specific brand of appliance identifiable from the time-dependent pattern in the power usage profile.

12. The article of manufacture of claim 9, comprising instructions to identify a power consumption identity code occurring in the time-dependent pattern in the power usage profile that indicates the particular type of power-consuming device that consumed power when the power usage profile was sampled.

13. The article of manufacture of claim 12, wherein the power consumption identity code comprises a series of pulses of energy consumption in the power usage profile that identify the particular type of power-consuming device as a specific class of appliance.

14. The article of manufacture of claim 12, wherein the power consumption identity code comprises a series of pulses of energy consumption in the power usage profile that identify the particular type of power-consuming device as a specific brand of appliance.

15. The article of manufacture of claim 12, wherein the instructions to identify the power consumption identity code comprise instructions to identify a specific number of pulses of power consumption in the power usage profile, amplitudes of pulses of power consumption in the power usage profile, or spacing of pulses in the power usage profile, or any combination thereof.

16. The article of manufacture of claim 9, wherein the instructions to issue the request to the consumer comprise instructions to issue the request to the consumer via a utility meter interface associated with the consumer.

17. The article of manufacture of claim 9, wherein the instructions to issue the request to the consumer comprise instructions to issue the request to the consumer via a communication channel other than through a utility meter interface associated with the consumer.

18. The article of manufacture of claim 17, wherein the communication channel comprises text message, website, email, or telephone, or any combination thereof.

19. A method comprising:
sending a request to a consumer not to run a particular type of power-consuming device during a forthcoming demand response event, wherein the particular type of power-consuming device is configured to be prevented from running by the consumer rather than an external entity during the demand response event;
receiving an indication that the user has agreed to the request;
receiving a power usage profile in an electronic device before a start of the demand response event, wherein the power usage profile represents total power consumption over time by all power-consuming devices run by the consumer measured by a power meter for some period of time before the start of the demand response event;
determining, using the electronic device, whether a time-dependent pattern of power consumption in the power usage profile indicates that the consumer is running the particular type of power-consuming device before the start of the demand response event;
when the time-dependent pattern of power consumption in the power usage profile indicates that the consumer is running the particular type of power-consuming device before the start of the demand response event, causing an indication to be displayed at the power meter that the particular type of power-consuming device has been determined to be running before the start of the demand response event to alert the consumer that the consumer will not be in compliance with the agreement when the demand response event starts unless the consumer stops running the particular type of power-consuming device;
before the start of the demand response event, causing an indication to be displayed at the power meter requesting that the consumer not run the particular type of power-consuming device during the demand response event;
receiving in the electronic device a second power usage profile but not an express status of the particular type of power-consuming device, wherein the second power usage profile represents total power consumption over time by all power-consuming devices run by the consumer measured by the power meter during the demand response event and ending approximately when the demand response event ends; and
determining whether the consumer complied with the agreement not to run the particular type of power-consuming device during the demand response event based at least in part on the second power usage profile.

* * * * *